United States Patent [19]
Kobayashi et al.

[11] Patent Number: 5,528,617
[45] Date of Patent: Jun. 18, 1996

[54] SEMICONDUCTOR LASER WITH ALINP OR ALGAINP BURYING LAYER

[75] Inventors: Ryuji Kobayashi; Hitoshi Hotta; Kenichi Kobayashi, all of Tokyo, Japan

[73] Assignee: NEC Corporation, Tokyo, Japan

[21] Appl. No.: 377,245

[22] Filed: Jan. 24, 1995

[30] Foreign Application Priority Data

Jan. 24, 1994 [JP] Japan ................................ 6-005680
Oct. 19, 1994 [JP] Japan ................................ 6-253325

[51] Int. Cl.[6] ........................................................ H01S 3/19
[52] U.S. Cl. ........................................... 372/46; 372/45
[58] Field of Search ...................................... 372/45, 46

[56] References Cited

U.S. PATENT DOCUMENTS

| | | | |
|---|---|---|---|
| 5,379,312 | 1/1995 | Bow et al. | 372/45 |
| 5,383,214 | 7/1995 | Kidoguchi et al. | 372/46 |

FOREIGN PATENT DOCUMENTS

| | | |
|---|---|---|
| 0579244 | 1/1994 | European Pat. Off. . |
| 4154183 | 5/1992 | Japan . |
| 5-121828 | 5/1993 | Japan . |
| 5-291683 | 11/1993 | Japan . |

OTHER PUBLICATIONS

N. Buchan et al, Compositional Variation and Ordering of $Ga_xIn_{1-x}P$ on Gatts Structured Substrates, 21 Dec. 1992, Appl. Phys. Lett. 61 (25), pp. 2996–2998 (copy in file).

Kawata et al, Room–Temperature Continuous–Wave Operation of a 640 nm AlGaInP Visible–Light Semiconductor Laser Electronics Letter vol. 23 No. 24, pp. 1327–1328, Nov. 19, 1987.

Novel selective area growth of AiGaAs and AlAs with HCl gas by MOVPE, by K. Shimoyama et al Journal of Crystal Growth 124 (1992) pp. 235–242, 1992 (No Month).

A Real–Index Guided inGaAlP Visible Laser Diode with a Small Beam Astigmatism, by Masaki Okajima, et al. IEEE Journal of Quantum Electronics vol. 27, No. 6 Jun. 1991.

Patent Abstracts of Japan, vol. 18, No. 80 (E–1505)., Nov. 1993.

Patent Abstracts of Japan, vol. 17, No. 484 (E–1426), May 1993.

Patent Abstracts of Japan, vol. 13, No. 323 (E–791), Apr. 1989.

Patent Abstracts of Japan, vol. 15, No. 397 (E–1120), Jul. 1991.

*Primary Examiner*—James W. Davie
*Attorney, Agent, or Firm*—Sughrue, Mion, Zinn, Macpeak & Seas

[57] ABSTRACT

A semiconductor laser having improved reliability. The laser contains an AlGaInP first cladding layer of a first conductivity type, an AlGaInP second cladding layer of a second conductivity type that forms a mesa stripe, an active layer made of an undoped GaInP layer, an undoped AlGaInP layer, or a quantum well layer of an undoped GaInP sublayer and an undoped AlGaInP sublayer. The laser further contains a burying layer made of an $Al_xIn_{1-x}P$ or $(Al_yGa_{1-y})_xIn_{1-x}P$ layer, which is placed at both sides of the mesa stripe to bury the stripe. The burying layer is larger in energy band gap than the active layer and smaller in refractive index than the second cladding layer. The burying layer has first regions that are contacted with and extend along respective side faces of the mesa stripe. An Al composition x of the first regions is set so that the first regions are lattice-matched to GaAs. The burying layer has second regions that are joined with respective bottom ends of the first regions and extend along the active layer. An Al composition x of the second regions is set so that the second regions are lattice-matched or are not lattice-matched to GaAs.

6 Claims, 5 Drawing Sheets

SEMICONDUCTOR LASER WITH AlINP OR AlGAINP BURYING LAYER

BACKGROUND OF THE INVENTION

1. Field of the Invention

The present invention relates to a semiconductor laser and a fabrication method thereof and more particularly, to a semiconductor laser having a mesa stripe and an AlInP or AlGaInP burying layer that buries the mesa stripe at its both sides, and a fabrication method thereof by Metal-Organic Vapor Phase Epitaxy (MOVPE).

2. Description of the Prior Art

A 600 nm-band AlGaInP-system semiconductor laser, the lasing light of which is red, plays an important role as a light source for optical disks such as a compact disk (CD), a magneto-optical (MO) disk.

The semiconductor laser of this sort typically has such a structure as shown in FIG. 1 and is fabricated by MOVPE. This structure is disclosed in Electronics Letters, Vol. 23, No. 24, Nov. 1987, PP1327.

In FIG. 1, an n-$(Al_{0.6}Ga_{0.4})_{0.5}In_{0.5}P$ cladding layer 22 is formed on an n-GaAs substrate 21. An undoped AlGaInP/GaInP active layer 23 with a Quantum Well (QW) structure is formed on the n-cladding layer 22.

A p-$(Al_{0.6}Ga_{0.4})_{0.5}In_{0.5}P$ inner cladding layer 24 is formed on the active layer 23. A p-$Ga_{0.5}In_{0.5}P$ etching stop layer 25 is formed on the inner cladding layer 24.

A p-$(Al_{0.6}Ga_{0.4})_{0.5}In_{0.5}P$ outer cladding layer 26 is formed on the etching stop layer 25. An undoped $Ga_{0.5}In_{0.5}P$ buffer layer 27 is formed on the outer cladding layer 26. A p-GaAs cap layer 28 is formed on the buffer layer 27. These three layers 26, 27 and 28 constitute a mesa stripe.

An n-GaAs current-blocking layer or burying layer 30 is selectively formed on the etching stop layer 25 at both sides of the mesa stripe to bury the mesa stripe therebetween.

A p-GaAs contact layer 29 is formed on the burying layer 30 and the uncovered cap layer 28.

With this conventional semiconductor laser, the current-blocking or burying layer 30 is narrower in energy band gap than the active layer 23. Therefore, there is a problem that energy loss increases in the cavity or resonator of the laser because the lasing light is absorbed by the layer 30, decreasing the external quantum efficiency.

To solve this problem, another conventional semiconductor laser shown in FIG. 2 has been developed, which is termed a real-index guided laser. In this laser, an AlInP or AlGaInP layer that is wider in energy band gap than the AlGaInP/GaInP QW active layer 23 is employed as the current-blocking or burying layer 30.

Such the laser is, for example, disclosed in the Japanese Non-Examined Patent Publication No. 4-154183 (May, 1992).

The conventional real-index guided laser shown in FIG. 2 has the same structure as that of the laser shown in FIG. 1 excepting that an n-AlInP current-blocking layer 31 and an n-GaAs cap layer 32 are formed instead of the n-GaAs current-blocking layer 30.

The n-AlInP current-blocking layer 31 is selectively formed on the etching stop layer 25 at both sides of the mesa stripe to cover the respective side faces of the mesa stripe and the uncovered surface of the etching stop layer 25. The layer 31 is made of first regions 31a that are contacted with and extend along the respective side faces of the mesa stripe, and second regions 31b that are joined with respective bottom ends of said first regions and extend along the surface of the etching stop layer 25.

The n-GaAs cap layer 32 is selectively formed on the current-blocking layer 31 at the both sides of the mesa stripe to bury the mesa stripe and the current-blocking layer 31.

The p-GaAs contact layer 29 is formed to be contacted with the cap layer 28, the current-blocking layer 31 and the n-GaAs cap layer 32.

In fabrication of the conventional real-index guided semiconductor laser of FIG. 2, typically, the growth conditions such as the growth temperature and the supply rates of source materials for the above semiconductor layers are set so that $Al_xIn_{1-x}P$ or $(Al_yGa_{1-y})_xIn_{1-x}P$ is lattice-matched to the (001)-plane of GaAs, in other words, the composition x is equal to 0.5 (i.e., x=0.5).

In this case, however, the first regions 31a contacted with the side faces of the mesa stripe, each of which is formed of the (111)-plane, are grown to be In-excessive, i.e., x<0.5, because In atoms are more readily incorporated into the lattice sites than Al atoms.

Accordingly, some lattice strain occurs due to lattice-mismatch, so that sudden deterioration of the laser tends to take place. This is a serious problem relating to the operation reliability of the laser.

On the other hand, a semiconductor material containing Al such as AlGaAs and AlInP is difficult to be grown selectively at the both sides of the mesa stripe by the popular MOVPE techniques. However, a selective growth method of AlGaAs has been realized by adding hydrogen chrolide (HCl) during the growth process of the Al-containing semiconductor material, which is disclosed in Journal of Crystal Growth, Vol. 124, 1992, pp235–242.

In this selective growth method, the first regions 31a contacted with the side faces of the mesa stripe are grown to be Ga-excessive, because Ga atoms are more readily incorporated into the lattice sites than Al atoms. This means that the first regions 31a are different in composition from the second regions 31b.

With AlGaAs, since the composition dependency of the lattice constant is comparatively small, there is no possibility of the lattice strain in spite of the composition difference between the first regions 31a and the second regions 31b.

On the contrary, with AlInP and AlGaInP, since the composition dependency of the lattice constant is comparatively large, the lattice strain due to the composition difference or lattice-mismatch tends to take place. This is a serious problem relating to fabrication and operation reliability of the laser.

SUMMARY OF THE INVENTION

Accordingly, an object of the present invention is to provide a semiconductor laser with an AlInP or AlGaInP burying layer that has improved operation reliability compared with the conventional ones and a fabrication method thereof.

A semiconductor laser according to the present invention contains an AlGaInP first cladding layer of a first conductivity type, an AlGaInP second cladding layer of a second conductivity type that forms a mesa stripe, an active layer made of an undoped GaInP layer, an undoped AlGaInP layer, or a quantum well layer of an undoped GaInP sublayer and an undoped AlGaInP sublayer.

The laser further contains a burying layer made of an $Al_xIn_{1-x}P$ or $(Al_yGa_{1-y})_xIn_{1-x}P$ layer, which is placed at both sides of the mesa stripe to bury the stripe.

The burying layer is larger in energy band gap than the active layer and smaller in refractive index than the second cladding layer. The burying layer has first regions that are contacted with and extend along respective side faces of the mesa stripe. An Al fraction x of the first regions is set so that the first regions are lattice-matched to GaAs.

The burying layer has second regions that are joined with respective bottom ends of the first regions and extend along the active layer. An Al fraction x of the second regions may be set so that the second regions are lattice-matched or are not lattice-matched to GaAs.

With the semiconductor laser according to the present invention, the first regions of the burying layer, which are contacted with and extend along respective side faces of the mesa stripe, are lattice-matched to GaAs. Therefore, no lattice strain takes place at the interface between the burying layer and the side faces of the mesa stripe.

As a result, no deterioration of the laser occurs due to the lattice strain, improving the operation reliability of the laser compared with the conventional ones.

A fabrication method of a semiconductor laser according to the present invention contains the following steps:

First, a layered structure made of an AlGaInP first cladding layer of a first conductivity type, an active layer, and a second AlGaInP cladding layer of a second conductivity type is formed. The active layer is made of one of an undoped GaInP layer, an undoped AlGaInP layer, and a quantum well layer of an undoped GaInP sublayer and an undoped AlGaInP sublayer. The active layer is sandwiched between the first cladding layer and the second cladding layer. The second cladding layer forms the mesa stripe.

Next, a burying layer is selectively grown at both sides of the mesa stripe to bury the mesa stripe at a growth temperature ranging from 550° C. to 620° C. while adding a Cl-containing material. The burying layer is made of an $(Al_yGa_{1-y})_xIn_{1-x}P$ or $Al_xIn_{1-x}P$ layer. The burying layer has an energy band gap larger than that of the active layer and a refractive index smaller than that of the second cladding layer.

Thus, the burying layer has first regions that are contacted with and extend along respective side faces of the mesa stripe. An Al fraction x of the first regions is set so that the first regions are lattice-matched to GaAs, which is realized by controlling the supply rates of the source materials of the burying layer.

The burying layer has second regions that are joined with respective bottom ends of the first regions and extend along the active layer. An Al fraction x of the second regions may be set so that the second regions are lattice-matched or are not lattice-matched to GaAs.

If the growth temperature is lower than 550° C., the burying layer cannot be grown with a satisfactory quality, and if it is higher than 620° C., the Al fraction x of the second regions cannot be set so that the second regions are lattice-matched to GaAs or the Al fraction x of the second regions becomes smaller than that of the first regions.

The addition of the Cl-containing material is carried out for the purpose of selective growth of the $Al_xIn_{1-x}P$ or $(Al_yGa_{1-y})_xIn_{1-x}P$ burying layer at the both sides of the mesa stripe.

HCl or $PCl_3$ is preferably used as the Cl-containing material, however, any other Cl-containing material may be used.

With the fabrication method of the present invention, Al atoms and In atoms are incorporated into the lattice in the first regions and the second regions of the $Al_xIn_{1-x}P$ or $(Al_yGa_{1-y})_xIn_{1-x}P$ burying layer at almost the same incorporation ratio.

Therefore, the Al fraction x becomes 0.5 in the first regions and at the same time, it becomes 0.5 or almost 0.5 in the second regions. This means that the burying layer has an almost uniform composition over the first regions and the second regions.

Accordingly, with the method of the present invention, the semiconductor laser according to the invention can be readily provided.

DETAILED DESCRIPTION OF THE PREFERRED EMBODIMENTS

Figure 1:
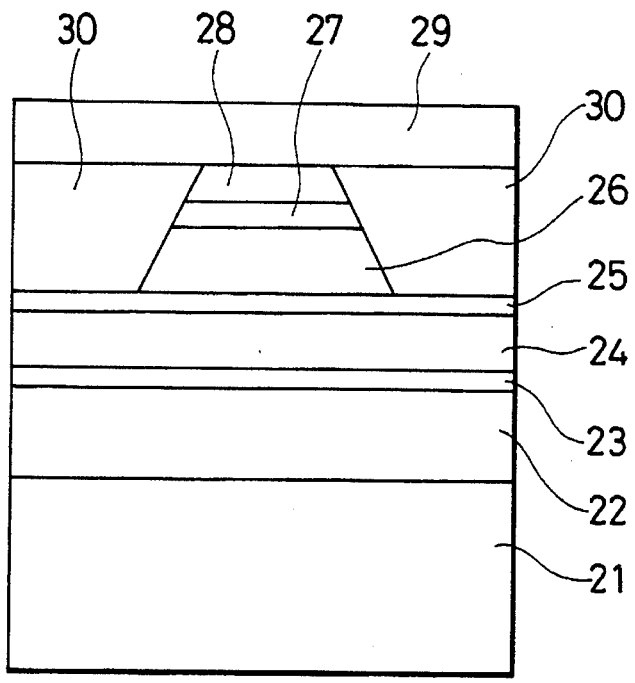
FIG. 1 is a cross-sectional view of a conventional semiconductor laser.

Preferred embodiments of the present invention will be described bellow while referring to the drawings attached.

First Embodiment

Figure 3:
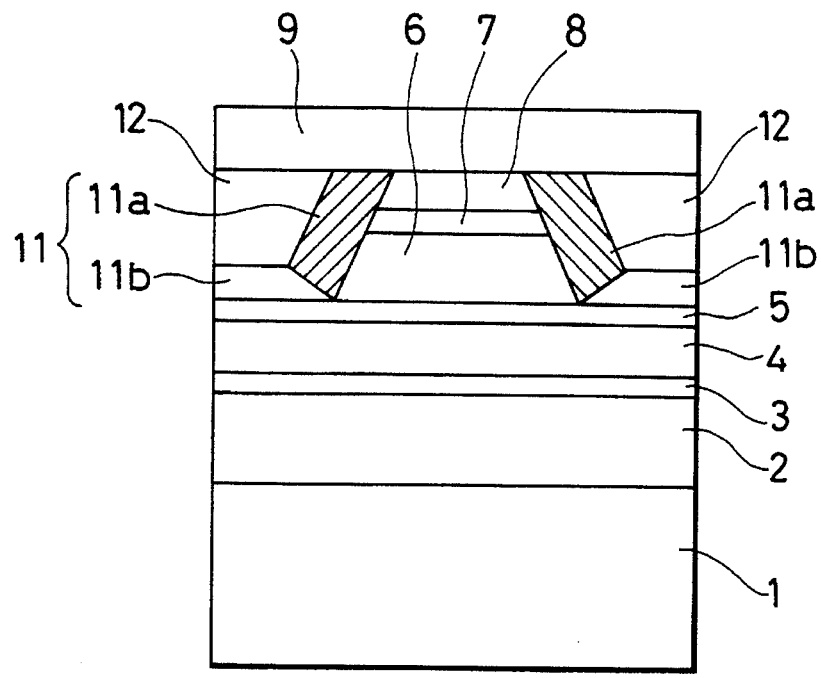
FIG. 3 is a cross-sectional view of a semiconductor laser according to a first embodiment of the present invention.

A real-index guided semiconductor QW laser according to a first embodiment is shown in FIG. 3, which oscillates at a single mode.

In FIG. 3, an n-$(Al_{0.6}Ga_{0.4})_{0.5}In_{0.5}P$ cladding layer 2 is formed on an n-GaAs substrate 1. An undoped AlGaInP/GaInP active layer 3 with a QW structure is formed on the n-cladding layer 2. A p-$(Al_{0.6}Ga_{0.4})_{0.5}In_{0.5}P$ inner cladding layer 4 is formed on the active layer 3. A p-$Ga_{0.5}In_{0.5}P$ etching stop layer 5 is formed on the inner cladding layer 4.

A p-$(Al_{0.6}Ga_{0.4})_{0.5}In_{0.5}P$ outer cladding layer 6 is formed on the etching stop layer 5. An undoped $Ga_{0.5}In_{0.5}P$ buffer layer 7 is formed on the outer cladding layer 6. A p-GaAs cap layer 8 is formed on the buffer layer 7. These three layers 6, 7 and 8 constitute a mesa stripe.

An n-AlInP current-blocking layer or burying layer 11 is selectively formed on the etching stop layer 5 at both sides of the mesa stripe. An n-AlInP current-blocking layer 11 is selectively formed on the etching stop layer 5 at both sides of the mesa stripe to cover the respective side faces of the mesa stripe and the uncovered surface of the etching stop layer 5.

The current-blocking or burying layer 11 has first regions 11a that are contacted with and extend along the respective side faces of the mesa stripe, and second regions 11b that are joined with respective bottom ends of said first regions 11a and extend along the surface of the etching stop layer 5.

An n-GaAs cap layer 12 is selectively formed on the current-blocking layer 11 at the both sides of the mesa stripe to bury the mesa stripe and the current-blocking layer 11.

A p-GaAs contact layer 9 is formed on the burying layer 11 and the uncovered cap layer 8. The contact layer 9 is contacted with the cap layer 8, the current-blocking layer 11 and the cap layer 12.

An Al fraction x of the first regions is set so that the first regions 11a of the burying layer 11 are lattice-matched to the (001)-plane of GaAs, i.e., x=0.5. Therefore, the first regions 11a have the composition of $Al_{0.5}In_{0.5}P$.

On the other hand, an Al fraction x of the second regions 11b of the burying layer 11 is set so that the second regions 11b are not lattice-matched to the (001)-plane of GaAs, i.e., x=0.43. Therefore, the second regions 11b have the composition of $Al_{0.43}In_{0.57}P$.

The semiconductor laser with the mesa structure described above is fabricated by the following process steps. These process steps are carried out using a reduced-pressure MOVPE method at a pressure of 70 Torr. This fabrication is carried out under almost the same conditions as those disclosed in the Japanese Non-Examined Patent Publication No. 4-154183, except that the growth temperature and the material supplying rates of the burying layer 11.

Trimethylaluminum (TMAl), Triethylgalium (TEGa), Trimethylindium (TMIn) and phosphine ($PH_3$) are used as source materials of Al, Ga, In and P, respectively. Disilane ($Si_2H_6$) and diethylzinc (DEZn) are used as n- and p-type dopants, respectively.

10% hydrogen chloride (HCl) diluted by hydrogen ($H_2$) is added during the process of growing the burying layer 11. A $H_2$ gas is used as a carrier gas and the flow rate thereof is 15 litter/min.

In a first growth process, on the n-GaAs substrate 1 doped with silicon (Si) at a doping concentration of $2\times10^{18}$ atoms/$cm^3$, the surface of which is the (001)-plane, the n-$(Al_{0.6}Ga_{0.4})_{0.5}In_{0.5}P$ cladding layer 2 and a doping concentration of $2\times10^{17}$ atoms/$cm^3$, the undoped AlGaInP/GaInP QW active layer 3 with a thickness of 0.1 μm, the p-$(Al_{0.6}Ga_{0.4})_{0.5}In_{0.5}P$ inner cladding layer 4 with a thickness of 0.2 μm and a doping concentration of $6\times10^{17}$ atoms/$cm^3$, the p-$Ga_{0.5}In_{0.5}P$ etching stop layer 5 with a thickness of 5 nm and a doping concentration of $5\times10^{17}$ atoms/$cm^3$, the p-$(Al_{0.6}Ga_{0.4})_{0.5}In_{0.5}P$ outer cladding layer 6 with a thickness of 1.3 μm and a doping concentration of $6\times10^{17}$ atoms/$cm^3$, the p-type $Ga_{0.5}In_{0.5}P$ buffer layer 7 with a thickness of 10 nm and a doping concentration of $5\times10^{17}$ atoms/$cm^3$, and the p-GaAs cap layer 8 with a thickness of 0.25 μm and a doping concentration of $1\times10^{18}$ atoms/$cm^3$ are epitaxially grown, successively. Thus, the structure as shown in FIG. 6A is obtained.

The growth temperature or the substrate temperature is set at 660° C. through the first growth process.

Figure 6A:
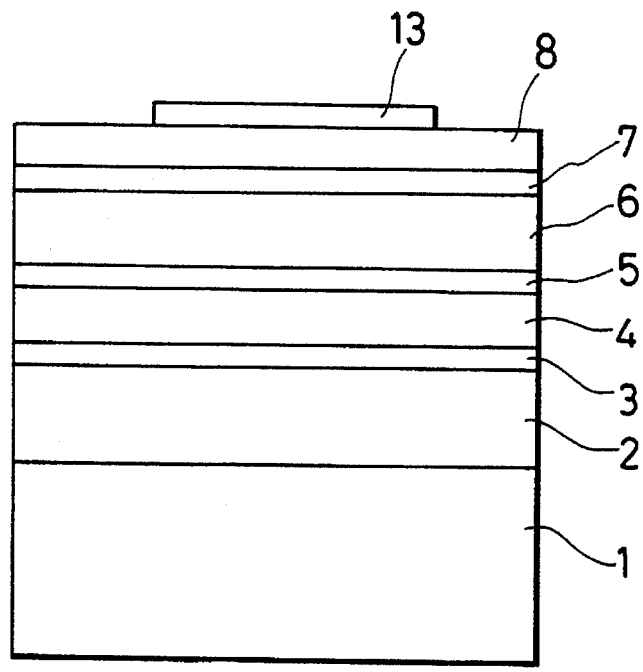
FIGS. 6A to 6C are cross-sectional views showing a fabrication method of the semiconductor laser according to the first embodiment, respectively.
Figure 6B:
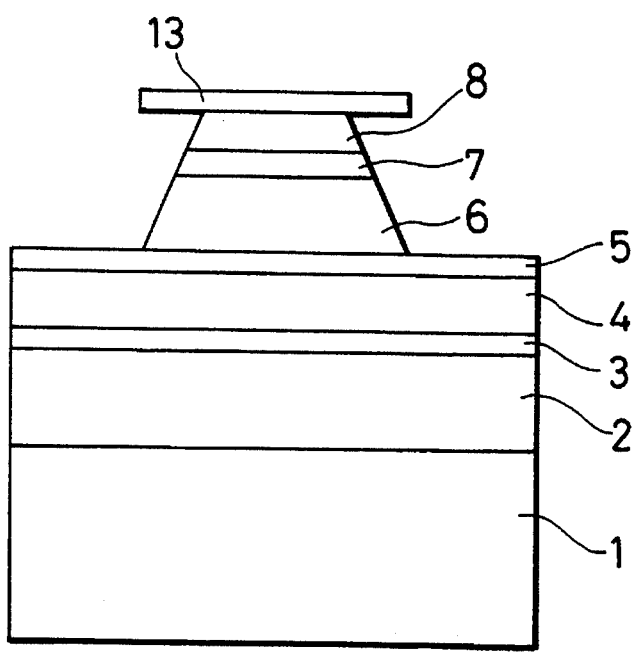

Next, as shown in FIG. 6A, a silicon nitride ($Si_3N_4$) film 13 is formed on the cap layer 8 and then, is patterned by photolithography to be a stripe with a width of 6 μm. Using this $Si_3N_4$ film 13 thus patterned as a mask, the cap layer 8, the buffer layer 7, and the outer cladding layer 6 are selectively removed by wet etching to produce the mesa stripe, as shown in FIG. 6B. The endpoint the etching action is determined by the etching stop layer 5.

Subsequently, in a second growth process, the n-AlInP current-blocking layer 11 with a thickness of 0.2 μm and a doping concentration of $1\times10^{17}$ atoms/$cm^3$ is selectively grown on the etching stop layer 5 at both sides of the mesa stripe while adding HCl. The layer 11 covers the respective side faces of the mesa stripe and the uncovered surface of the etching stop layer 5.

The V/III flow rate ratio of the second growth process, i.e., [TMAl/(TMAl+TMIn)], is 0.24 in order to make the first regions 11a of the burying layer 11 lattice-matched. On the other hand, with the conventional method disclosed in the Japanese Non-Examined Patent Publication No. 4-154183, the V/III flow rate ratio of the second growth process is 0.26.

Then, Using this $Si_3N_4$ film 13 patterned as a mask, the n-GaAs cap layer 12 with a thickness of 0.4 μm and a doping concentration of $1\times10^{18}$ atoms/$cm^3$ is selectively grown on the current-blocking layer 11 at both sides of the mesa stripe while not adding HCl. The growth temperature is 660° C. through the second growth process. The film 13 is then removed.

Through this second growth process, the compositions of the first regions 11a and the second regions 11b become $Al_{0.5}In_{0.5}P$ and $Al_{0.43}In_{0.57}P$, respectively, due to the lattice-constant difference. Therefore, the first regions 11a are lattice-matched to the (001)-plane of GaAs, and the second regions 11b are not lattice-matched thereto.

Figure 6C:
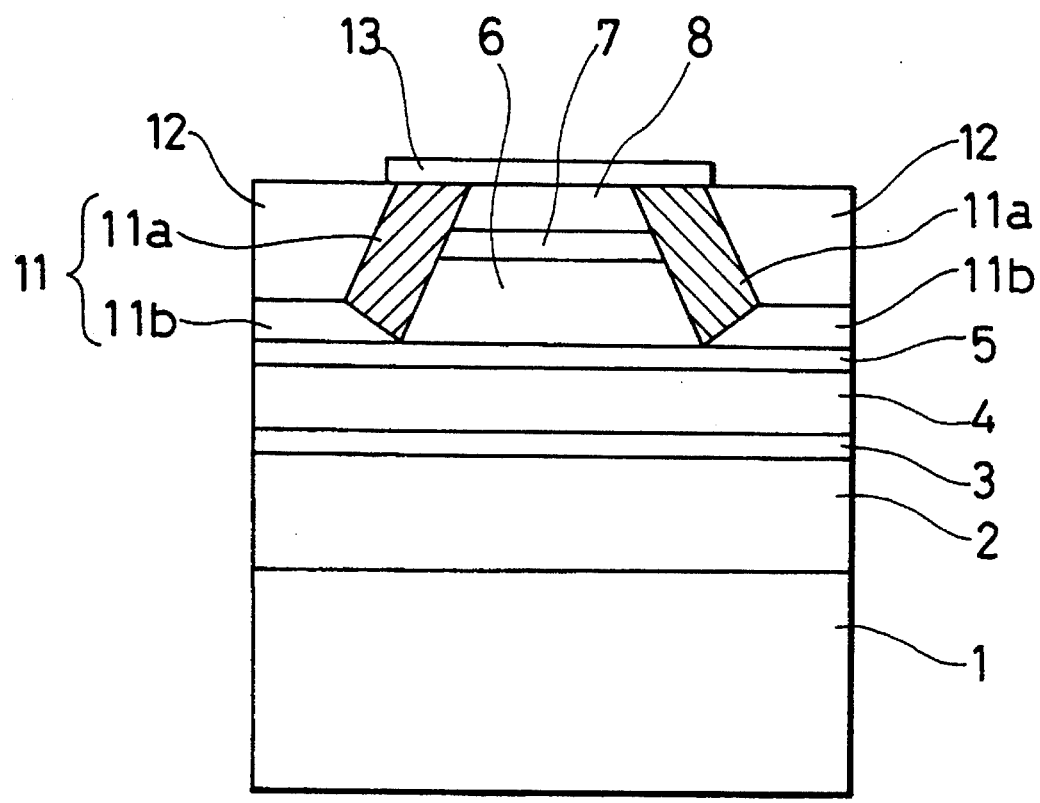

Finally, in a third growth process, the p-GaAs contact layer 9 with a thickness of 3 μm and $3\times10^{18}$ atoms/$cm^3$ is grown on the burying layer 11 and the uncovered cap layer 8 to be contacted with the cap layer 8, the current-blocking layer 11 and the cap layer 12, as shown in FIG. 6C. The growth temperature is set at 660° C. through the third growth process.

Thus, the semiconductor laser according to the first embodiment is obtained.

Figure 4:
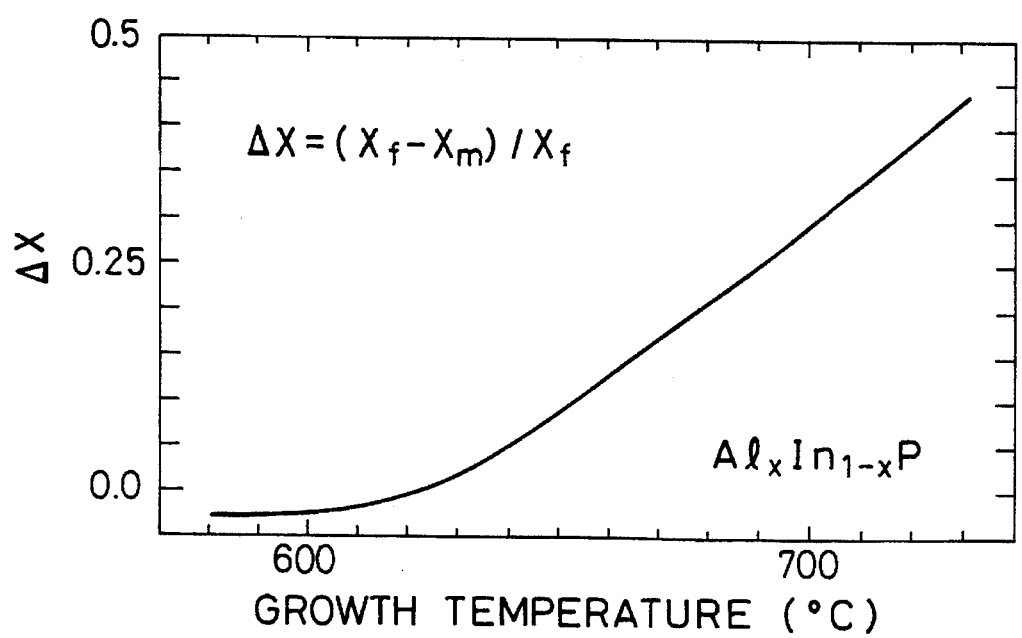
FIG. 4 is a graph showing a relationship between the Al fraction variation $\Delta x$ of the $Al_xIn_{1-x}P$ burying layer and the growth temperature thereof.

FIG. 4 shows the growth temperature dependency of the Al fraction variation $\Delta x$ of the $Al_xIn_{1-x}P$ burying layer 11, which was obtained by using an electron probe microanalysis (EPMA) system.

It is seen from FIG. 4 that the first regions 11a becomes In-excessive compared with the second regions 11b by about 14%, i.e., $\Delta x \approx 0.14$ at the growth temperature of 660° C. Therefore, with the conventional semiconductor laser of FIG. 2 in which the second regions 11b are lattice-matched to GaAs, the first regions 11a are not lattice-matched to GaAs, so that lattice strain occurs because of the In-excessive composition in the first regions 11a.

The lattice strain thus occurred affects to the active layer 3 from which the lasing light is emitted, resulting in sudden deterioration and/or the threshold current increase of the laser.

On the other hand, with the semiconductor laser according to the first embodiment, the current-blocking layer 11 is grown so that the composition of the layer becomes $Al_{0.5}In0.5P$ that is lattice-matched to GaAs in order to restrain the lattice strain in the first regions 11a. Therefore, no lattice strain occurs in the first regions 11a.

Figure 2:
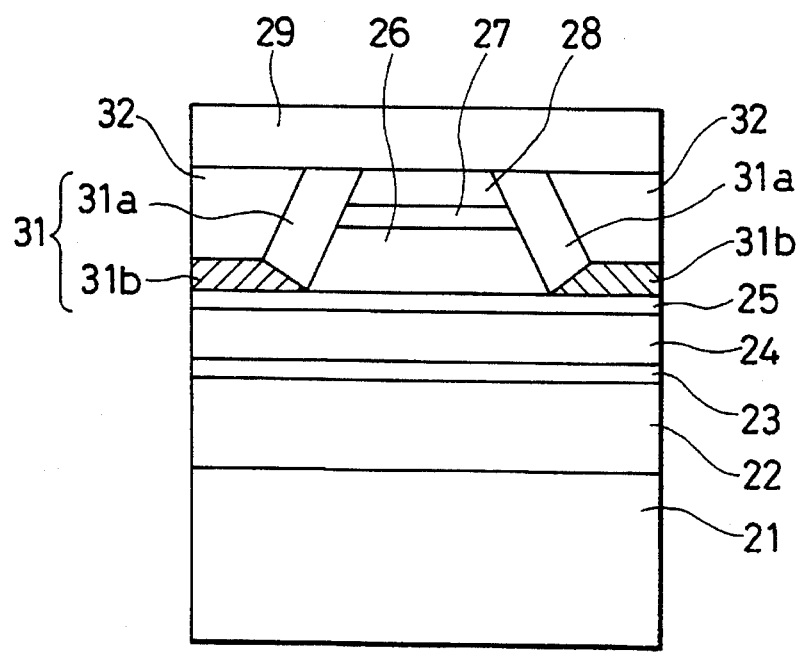
FIG. 2 is a cross-sectional view of another conventional semiconductor laser.

To confirm the effects or advantages of the invention, the laser of the first embodiment and the conventional laser of FIG. 2 were practically fabricated, and then, a continuous operation test was performed. In this test, an electric current (about 80 to 100 mA) was injected into each laser to emit a constant optical output of 30 mW for 100 hours at 20° C.

As a result, with the semiconductor laser according to the first embodiment, almost all the samples did not show the sudden deterioration after 100 hours passed. However, with the conventional semiconductor laser shown in FIG. 2, almost all the samples showed the sudden deterioration.

Concretely, the deterioration rates of the invention and the conventional one were (2/15)% and (13/15)%, respectively.

From the test, the laser of the first embodiment has an advantage of less sudden deterioration and improved operation reliability.

Second Embodiment

Figure 5:
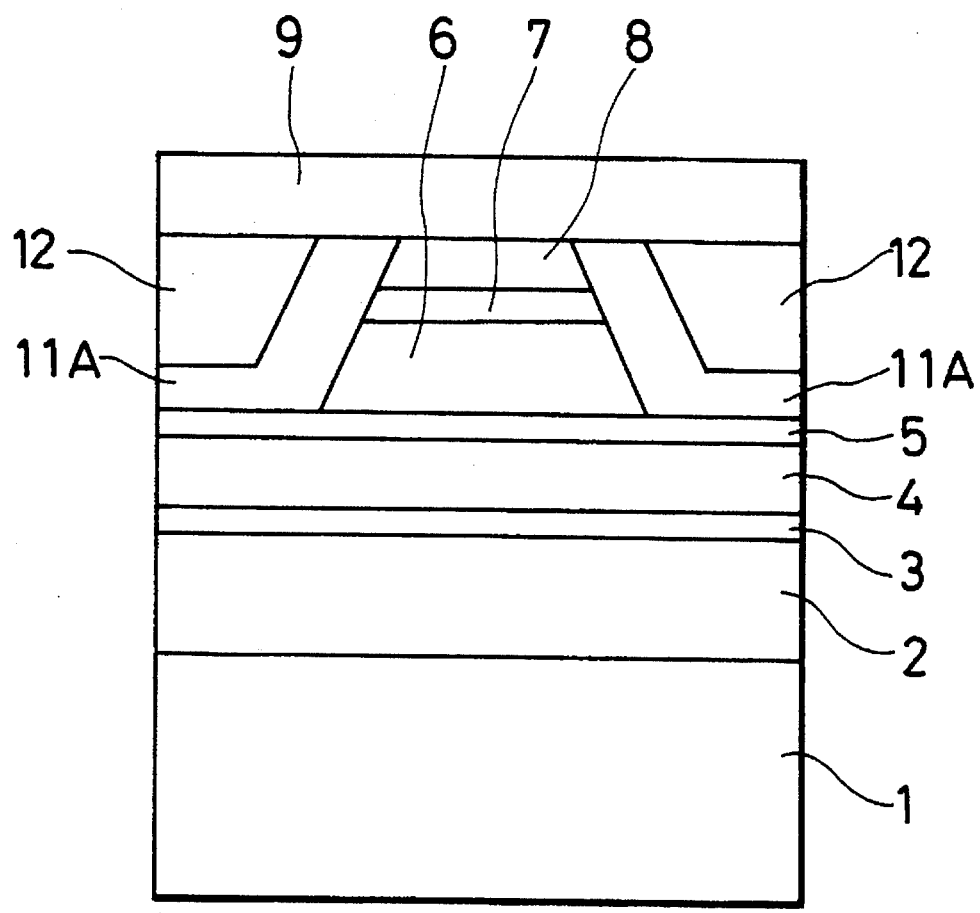
FIG. 5 is a cross-sectional view of a semiconductor laser according to a second embodiment of the present invention.

A real-index guided semiconductor QW laser according to a second embodiment is shown in FIG. 5, which oscillates at a single mode.

The second embodiment is the same in structure as the first embodiment other than that a current-blocking or burying layer 11A with a uniform composition entirely is provided instead of the burying layer 11.

The burying layer 11A entirely has a uniform composition of $Al_{0.5}In_{0.5}P$.

The laser of the second embodiment is fabricated by almost the same process steps as those of the first embodiment except for the growth temperature of the second growth process. The growth temperature during the second growth process is set to 620° C. because the composition difference $\Delta x$ is zero (i.e., $\Delta x=0$) at the growth temperature of 620° C. (see FIG. 4).

In the first and second embodiments, the current-blocking or burying layers 11 and 11A are made of AlInP, however, an AlGaInP layer may be used as the layer 11 or 11A if it is wider in energy band gap than the active layer 3 and smaller in refractive index than the cladding layers 4 and 6.

Also, in the case of an $(Al_yGa_{1-y})_xIn_{1-x}P$ layer, there is an additional advantage that the refractive index of the optical waveguide of the laser can be controlled voluntarily by changing the Al fraction y. This enables to expand the tolerance for the single-transverse mode oscillation conditions.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. In a semiconductor laser with a mesa stripe, said laser comprising:

an AlGaInP first cladding layer of a first conductivity type;

an AlGaInP second cladding layer of a second conductivity type, said second cladding layer forming said mesa stripe;

an active layer made of one of an undoped GaInP layer, an undoped AlGaInP layer, and a quantum well layer of an undoped GaInP sublayer and an undoped AlGaInP sublayer, said active layer being sandwitched between said first cladding layer and said second cladding layer;

a burying layer made of one of an $Al_xIn_{1-x}P$ layer and an $(Al_yGa_{1-y})_xIn_{1-x}P$ layer, said burying layer being placed at both sides of said mesa stripe to bury said mesa stripe; and said burying layer having an energy band gap larger than that of said active layer and having a refractive index smaller than that of said second cladding layer;

wherein said burying layer has first regions that are contacted with and that extend along respective side faces of said mesa stripe;

and wherein an Al composition x of said first regions is set so that said first regions are lattice-matched to GaAs.

2. A semiconductor laser as claimed in claim 1, wherein said burying layer has second regions that are joined with respective bottom ends of said first regions and that extend along said active layer;

and wherein an Al composition x of said second regions is set so that said second regions are not lattice-matched to GaAs.

3. A semiconductor laser as claimed in claim 1, wherein said burying layer has second regions that are joined with respective bottom ends of said first regions and that extend along said active layer;

and wherein an Al composition x of said second regions is set so that said second regions are lattice-matched to GaAs.

4. A semiconductor laser with a mesa stripe, said laser comprising:

a GaAs substrate;

an AlGaInP first cladding layer of a first conductivity type, said first cladding layer being formed on said substrate;

an active layer made of one of an undoped GaInP layer, an undoped AlGaInP layer and a quantum well layer of an undoped GaInP sublayer and an undoped AlGaInP sublayer, said active layer being formed on said first cladding layer;

an AlGaInP second cladding layer of a second conductivity type, said second cladding layer being formed on said active layer;

a GaInP etching stop layer formed on said second cladding layer;

a AlGaInP third cladding layer of said second conductivity type, said third cladding layer being formed on said etching stop layer, said third cladding layer forming said mesa stripe;

a burying layer made of one of an $Al_xIn_{1-x}P$ layer and an $(Al_yGa_{1-y})_xIn_{1-x}P$ layer, said burying layer being placed at both sides of said mesa stripe to bury said mesa stripe; and said burying layer having an energy band gap larger than that of said second cladding layer and having a refractive index smaller than that of said second cladding layer;

wherein said burying layer has first regions that are contacted with and that extend along respective side faces of said mesa stripe;

and wherein an Al composition x of said first regions is set so that said first regions are lattice-matched to GaAs.

5. A semiconductor laser as claimed in claim 4, wherein said burying layer has second regions that are joined with respective bottom ends of said first regions and that extend along said active layer;

and wherein an Al composition x of said second regions is set so that said second regions are not lattice-matched to GaAs.

6. A semiconductor laser as claimed in claim 4, wherein said burying layer has second regions that are joined with respective bottom ends of said first regions and that extend along said active layer;

and wherein an Al composition x of said second regions is set so that said second regions are lattice-matched to GaAs.

* * * * *